United States Patent
Wernersson

(10) Patent No.: US 7,962,034 B2
(45) Date of Patent: Jun. 14, 2011

(54) METHOD AND DEVICE FOR CREATING PICTURES

(75) Inventor: Mats Wernersson, Helsingborg (SE)

(73) Assignee: Sony Ericsson Mobile Communications AB, Lund (SE)

( * ) Notice: Subject to any disclaimer, the term of this patent is extended or adjusted under 35 U.S.C. 154(b) by 261 days.

(21) Appl. No.: 11/817,824

(22) PCT Filed: Feb. 9, 2006

(86) PCT No.: PCT/EP2006/050789
§ 371 (c)(1),
(2), (4) Date: Sep. 5, 2007

(87) PCT Pub. No.: WO2006/094871
PCT Pub. Date: Sep. 14, 2006

(65) Prior Publication Data
US 2008/0170848 A1  Jul. 17, 2008

(30) Foreign Application Priority Data

Mar. 8, 2005  (EP) .................................... 05101794
May 31, 2005  (EP) .................................... 05104695

(51) Int. Cl.
G03B 41/00  (2006.01)
G03B 17/00  (2006.01)
(52) U.S. Cl. ......................................... 396/335; 396/55
(58) Field of Classification Search .................. 396/335, 396/55
See application file for complete search history.

(56) References Cited

U.S. PATENT DOCUMENTS

| 6,778,210 | B1 | 8/2004 | Sugahara et al. | |
| 7,009,648 | B2 * | 3/2006 | Lauxtermann et al. | 348/308 |
| 7,057,645 | B1 * | 6/2006 | Hara et al. | 348/208.6 |
| 2004/0239775 | A1 | 12/2004 | Washisu | |

FOREIGN PATENT DOCUMENTS

| CN | 1469187 | | 1/2004 |
| CN | 1469456 | A | 1/2004 |
| EP | 1 152 472 | A1 | 11/2001 |
| EP | 1 152 472 | A2 | 11/2001 |
| JP | 2001-086398 | | 3/2001 |
| JP | 2003-224255 | | 8/2003 |

(Continued)

OTHER PUBLICATIONS

Basler Vision Technologies; A601fHDR User's Manual; Mar. 22, 2004; http://www.baslerweb.com/downloads/12065/A601f-HDR_Users_Manual_DA00065902.pdf.*

(Continued)

*Primary Examiner* — Rodney E Fuller
(74) *Attorney, Agent, or Firm* — Renner, Otto, Boisselle & Sklar

(57) ABSTRACT

The invention relates to a method and a device for creating an enhanced picture by means of several consecutive exposures. The method comprises the steps of: exposing a light sensitive sensor to a series of exposures, wherein the whole light sensitive sensor in each exposure is exposed simultaneously, and all the exposures of the series are combined to form a finished picture. Preferably, the exposures are combined with a correction for sharpness enhancement. The problem of motion distortion in an image stabilization system is solved by letting each exposure of the series be exposed by means of a global shutter.

11 Claims, 2 Drawing Sheets

FOREIGN PATENT DOCUMENTS

| JP | 2004-357202 | 12/2004 |
|----|-------------|---------|
| JP | 2005-026794 | 1/2005  |

OTHER PUBLICATIONS

International Search Report for corresponding Application No. PCT/EP2006/050789 mailed Apr. 6, 2006.

International Preliminary Report on Patentability for corresponding application No. PCT/EP2006/050789 dated Feb. 14, 2007.

Multiple Exposure Question-Canon EOS, Online Forum, Mar. 5, 2004, cited in the International Preliminary Report on Patentability as XP001152099.

Image Stacker Help, Online, Feb. 6, 2005, cited in the International Preliminary Report on Patentability as XP001152100.

Basler Vision Technologies; "A601f-HDR User's Manual"; Mar. 22, 2004; XP002335244; retrieved from the Internet: URL: http://www.baslerweb.com/popups/874/A601f-HDR_Users_Manual_DA00065902.pdf. (Previously cited in IDS of Sep. 5, 2007, copy being enclosed herewith).

Kodak; "Shutter Operations for CCD and CMOS Image Sensors"; Application Note; Dec. 17, 2003, XP002335245, pp. 3 and 4. (Previously cited in IDS of Sep. 5, 2007, copy being enclosed herewith).

Sasaki et al.; "A wide dynamic range CMOS image sensor with multiple short-time exposures"; Sensors 2004. Proceedings of IEEE, Vienna, Austria, Oct. 24-27, 2004, Piscataway, NJ, USA, IEEE; pp. 967-972. XP010793568. (Previously cited in IDS of Sep. 5, 2007, copy being enclosed herewith).

Japanese Office Action for corresponding application No. JP2008-500147 mailed Aug. 17, 2009.

Chinese Office Action for corresponding application No. 20060015555.7 mailed Jan. 29, 2010.

Office Action for corresponding Chinese Application No. 20060015555.7 mailed Apr. 10, 2009 (with translation).

Search Report for corresponding European Application No. 05 104 695.1 dated Mar. 28, 2007.

Tawbaware, Max Lyons, "Image Stacker", Jul. 6, 2002, Retrieved from the Internet: URL: http://web.archive.org/web/20021220192, XP001152025.

PC World, "Image Stacker review", Oct. 2004, Retrieved from the Internet: URL: http://www.pcworld.com/downloads/file/fid.24320-order,1-page,1-c,imageeditors/description.html#>, [retrieved on Mar. 22, 2007], XP001152026.

Rete Telematica Provincia Di Sondrio: "Dailydownloads" Jan. 3, 2005, Retrieved from the Internet: URL: http://fc.provincia.so.it/conferences/associazone%20galois/pstd/FOV1-000F304/F_OV-1-000269DC/DF7E1887-3B9ACA00>[retrieved on Mar. 22, 2007], XP001152027.

* cited by examiner

METHOD AND DEVICE FOR CREATING PICTURES

FIELD OF THE INVENTION

The present invention relates to a method for creating pictures and more particularly a method for creating an enhanced picture by means of several consecutive exposures. The exposures are combined to create pictures with enhanced properties, due to a global exposure of the sensor for each exposure.

The invention also relates to a device employing the method.

STATE OF THE ART

Today digital cameras may use a series of exposures to obtain sufficient light and the exposures are combined with software based image stabilization. The image stabilization reduces the effect of user handshake when taking a picture with relatively long exposure time. A number, e.g. 8, digitalized images, each taken at a short exposure time, are added in a memory. When a picture is added to a previous picture, or pictures, it is shifted in position to compensate for the movement caused by handshake. This results in a sharpness enhancement. However, if the sensor is exposed by means of a rolling shutter, each picture will be subjected to motion distortion. Due to the handshake, the motion distortion is randomly distributed and cannot be reduced by means of the image stabilization. The operation of a prior art rolling shutter is described more in detail below with reference to FIGS. 2A and 2B.

In some cameras existing today, global shutters are used. With a global shutter, the whole sensor is exposed to light at the same time. However, such a shutter has not been used together with image stabilization.

SUMMARY OF THE INVENTION

In the present invention, the problem of motion distortion in an image stabilization system is solved by letting each exposure of the series be exposed by means of a global shutter. In this way, no motion distortion will result from a rolling shutter, and the image stabilization can operate to form a stabilized picture with a sufficient total accumulated exposure time.

In a first aspect, the invention relates to a method for creating a picture comprising the steps of:
exposing a light sensitive sensor to a series of exposures, wherein the whole light sensitive sensor in each exposure is exposed simultaneously, and all the exposures of the series are combined to form a finished picture.

Preferably, the exposures are combined with a correction for sharpness enhancement.

In a preferred embodiment, the method for each exposure comprises the steps of:
resetting all pixels of the light sensitive sensor with a global shutter closed;
opening the global shutter;
exposing the whole light sensitive sensor to light for the desired exposure time;
closing the global shutter; and
reading out the pixels values.

Suitably, all pixels of the light sensitive sensor are reset simultaneously.

Suitably, the pixel values are read out in a rolling mode.

In a second aspect, the invention relates to a device for creating a picture comprising an optical system for exposing a light sensitive sensor, a mechanical or electronical global shutter capable of exposing the whole light sensitive sensor simultaneously.

According to the invention, the optical system is arranged to expose the light sensitive sensor for a series of exposures, so that the whole light sensitive sensor in each exposure is exposed simultaneously.

Preferably, the device is arranged to combine the series of exposures with a correction for sharpness enhancement.

In a preferred embodiment, the device is arranged to perform the following steps for each exposure:
resetting all pixels of the light sensitive sensor with the global shutter closed;
opening the global shutter;
exposing the whole light sensitive sensor to light for the desired exposure time;
closing the global shutter; and
reading out the pixels values.

Suitably, the device is arranged to reset all pixels of the light sensitive sensor simultaneously.

Suitably, the device is arranged to read out the pixel values in a rolling mode.

In a one embodiment, the sensor is a digital CMOS image sensor, and the global shutter is a mechanical shutter.

In another embodiment, the global shutter is an electronical shutter.

BRIEF DESCRIPTION OF THE DRAWINGS

The invention will be described in detail below with reference to the accompanying drawings, of which.

DETAILED DESCRIPTION OF PREFERRED EMBODIMENTS

The invention relates to a method for creating pictures and a device using the method, e.g. a digital camera, or a device incorporating a digital camera such as a mobile telephone etc. As mentioned in the introduction, the invention is useful when it is desired to take a picture in low-light conditions using the available light when several exposures are taken and combined preferably employing image stabilization.

Figure 1:
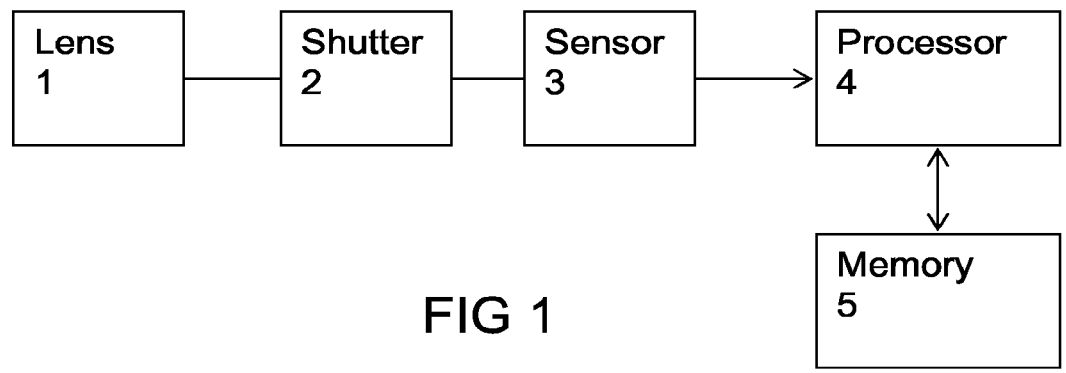
FIG. 1 is a schematic view of relevant parts of a camera according to the invention.

FIG. 1 illustrates relevant parts of a camera according to the invention. The camera comprises an optical system including a lens 1 and a global shutter 2. The optical system exposes a light sensitive sensor 3 to light, for instance a digital CMOS image sensor. A control unit comprising a processor 4 controls the operations of the lens 1 and shutter 2. The shutter 2 may be a mechanical shutter or the sensor 3 may be controlled electronically to obtain a desired exposure time and behaviour. The processor 4 communicates with the sensor 3 and with a memory 5, in which image data may be stored and retrieved. The processor 4 is capable of performing the necessary calculations for image processing.

The lens 1, shutter 2 and sensor 3 may be of conventional design. A wide range of components with varying quality and performance already exists on the market. Also, image processors handling image data in various ways are previously known. These components will not be described in detail in the present application. The memory 5 may be a working space of a memory incorporated in the device or may exist on a separate, removable memory card, storing working data as well as finished pictures. The processor and memory may be integrated in the camera design or reside externally or be shared with other functionalities.

For convenience, the general working principle of a light sensitive sensor, such as sensor 3, is described. The sensor comprises a number of light sensitive picture elements, so called pixels, typically between 1 and 10 Mpixels (million pixels) distributed over the sensor area. When light impinges on a pixel, the pixel produces a current that is integrated to obtain a light intensity value. As is known in the art, the light sensor is colour sensitive by means of colour filters.

To obtain sufficient light and colour in the finished picture, a series of exposures is taken in rapid succession. The exposures are either taken with a short exposure time and/or with a small aperture. A short exposure time will reduce motion blurredness, while a small aperture will increase the depth of field. Each exposure is sharp and in principle underexposed but all pixels exposed to light contributes with a light intensity value. The light intensity values are combined to get sufficient light in the picture. The light values are preferably combined employing a image stabilization system in such a way that image movement between the exposures are taken into account and a correction is made.

Figure 2A:
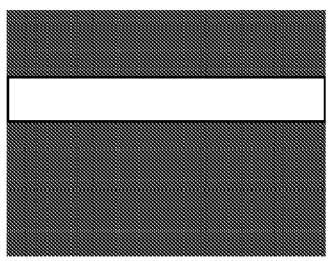
FIGS. 2A and 2B are schematic views illustrating the exposure in a rolling shutter according to prior art.

A conventional digital CMOS image sensor has a so called rolling shutter. A rolling shutter (similar to a focal plane shutter in an analog camera) is not exposing the whole image sensor to light simultaneously. The principle is illustrated in FIG. 2A. The dark rectangle represents the image sensor. Just a certain number of pixel rows are exposed to light simultaneously (as illustrated by the white band). The exposure area is moving over the sensor until the whole image is exposed. The exposure time is controlled by varying the height of the exposure area. The time it takes to move the exposure area over the entire sensor is called travel time, or exposure period, and is depending on the current frame rate.

Figure 2B:
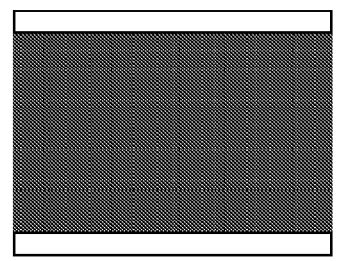

From this illustration it can be understood that the time it takes to expose a whole frame is longer than the effective exposure time. Furthermore, it should be noted that the exposure area rolls over to the top of the sensor after reaching the bottom. Hence, the sensor is for a while integrating light for two consecutive frames simultaneously as illustrated in FIG. 2B. When the last rows (bottom) of the sensor are exposed, the first rows (top) belonging to the next image frame are also exposed. The shutter rolls over from one frame to the next.

Figure 3A:
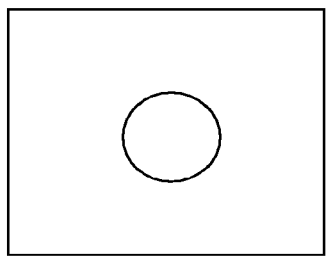
FIGS. 3A-3C are views illustrating motion distortion in various situations.
Figure 3B:
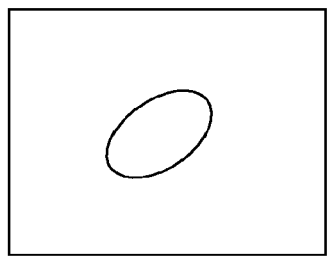
Figure 3C:
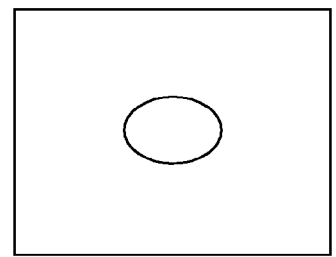

The principle of software based image stabilization is to add several "sharp" exposures, making adjustments for handshake when adding them. Each short exposure is fairly sharp due to the short exposure time or small aperture. However, any camera shake will result in a distorted image. The effect, called motion distortion, is illustrated in FIGS. 3A-C. Motion distortion occurs when the camera, or the object, is moved during the exposure of the image. FIG. 3A shows an undistorted image; in FIG. 3B the camera has moved in a horizontal direction; and in FIG. 3C the camera has moved in a vertical direction.

It should be noted that the shape of the circles in FIGS. 3A-3C are not changed by altering the exposure time. A short exposure time will only make the edges sharp. The travel time (frame rate) affects the shape, not the sharpness. The maximum frame rate in a typical 3 million pixel CMOS sensor is 10 frames per second, which equals a travel time of 100 ms. A period of 100 ms is quite long when we consider handshake. Handshake is usually not a movement in a well defined direction but rather an unpredictable movement in various directions randomly distributed.

Even if the individual short exposure frames are sharp, they will result in a blurred final image since the results of motion distortion in various directions are added together.

The present inventor has realized that the problem with motion distortion is completely removed if the whole image sensor is exposed to light simultaneously. This can be achieved by providing a so called global shutter. A global shutter can be a mechanical device or an electronic structure in the sensor's pixel design.

The invention proposes to use a mechanical global shutter (or possibly an electronic shutter) when taking the individual exposures, and combining the individual exposures preferably with software image stabilization. The shutter should be implemented in such a way that it can rapidly open and close as the consecutive short exposures are made.

Mechanical shutters are currently used in some digital still cameras having CMOS sensors. The shutter can mechanically block light from reaching the sensor. It is used in the following way:
1) The shutter closes
2) The sensor resets all pixels simultaneously, or at least before the shutter opens (global reset)
3) The shutter opens
4) The whole sensor is exposed to light for the desired exposure time
5) The shutter closes
6) The pixel values are read out in a "rolling mode" e.g. scanned from the top of the sensor to the bottom. As this is done behind a closed shutter the behaviour does not affect the image.

Figure 4:
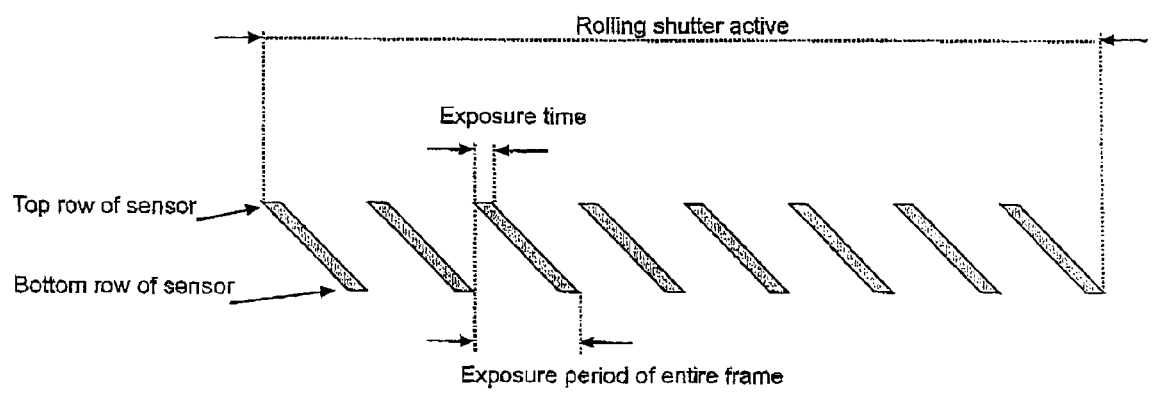
FIG. 4 is a diagram illustrating the exposure of eight consecutive image frames with a rolling shutter.
Figure 5:
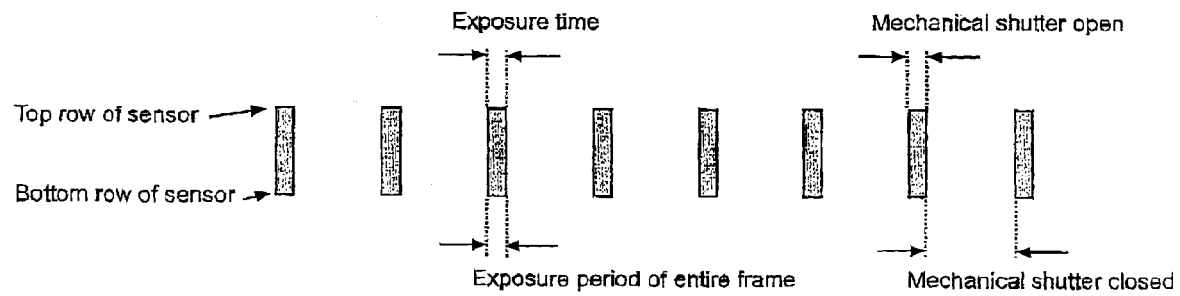
FIG. 5 is a diagram illustrating the exposure of eight consecutive image frames with a global shutter operating according to the present invention.

The diagrams of FIGS. 4 and 5 show the exposure of eight consecutive image frames. The invention is not restricted to any specific number of exposures.

FIG. 4 shows the effect of a rolling shutter according to the prior art. Although the exposure time is short enough to avoid image blur of the individual frames, the long exposure period of the entire frame introduces motion distortion due to handshake that will cause a blurred image when the individual images are combined.

FIG. 5 shows the effect of using a global shutter according to the present invention. The exposure time equals the exposure period of the entire frame. Both image blur and motion distortion are avoided. Any handshake that occurs between the exposures of the individual frames can be compensated when the images are stacked. The total accumulated exposure times of the sensor are equal in the two diagrams of FIGS. 4 and 5. This diagram also explains how the shutter should be synchronized with the frame periods of the camera.

A major problem in the current design of software image stabilization is solved. Significant image degradation will occur if an image stabilizer is used without a shutter due to motion distortion. The image will be blurred if a global shutter is used without an image stabilizer due to long exposure time.

The invention combines the strengths of the two techniques in such a way that the image quality is better than can be obtained with either of the techniques used separately.

Normally when a shutter is used it only opens once, while the invention proposes a series of opening and closing actions synchronized with the cameras frame rate.

By means of the present invention it is possible create a sharp image with correct exposure even in under low-light conditions. The invention enables taking sharp pictures despite long exposure times. The scope of the invention is only limited by the claims below.

The invention claimed is:

1. A method for creating a picture comprising the steps of:
   exposing a light sensitive sensor adapted to be exposed by means of a rolling shutter to a series of exposures, each exposure being underexposed;
   wherein the whole light sensitive sensor in each exposure is exposed simultaneously, for each exposure the method further comprising the steps of:
   resetting all pixels of the light sensitive sensor with a mechanical global shutter closed;
   opening the mechanical global shutter;
   exposing the whole light sensitive sensor to light for the desired exposure time;
   closing the mechanical global shutter; and
   reading out the pixels values in a rolling mode.

2. A method according to claim 1, wherein each exposure is taken with an exposure time that reduces motion blurredness.

3. A method according to claim 1, wherein each exposure is taken with an aperture that increases the depth of field.

4. A method according to claim 1, wherein the exposures are combined with a correction for sharpness enhancement.

5. A method according to claim 1, wherein all pixels of the light sensitive sensor are reset simultaneously.

6. A device for creating a picture comprising an optical system for exposing a light sensitive sensor adapted to be exposed by means of a rolling shutter, a mechanical global shutter capable of exposing the whole light sensitive sensor simultaneously, wherein:
   the optical system is arranged to expose the light sensitive sensor for a series of exposures, so that the whole light sensitive sensor in each exposure is exposed simultaneously, further each exposure being underexposed, and in that the device is arranged to combine all the exposures of the series to form a finished picture, the device is further arranged to perform the following steps for each exposure:
   resetting all pixels of the light sensitive sensor with the mechanical global shutter closed;
   opening the mechanical global shutter;
   exposing the whole light sensitive sensor to light for the desired exposure time;
   closing the mechanical global shutter; and
   reading out the pixels values in a rolling mode.

7. A device according to claim 6, wherein the device is arranged to take each exposure with an exposure time that reduces motion blurredness.

8. A device according to claim 6, wherein the device is arranged to take each exposure with an aperture that increases the depth of field.

9. A device according to claim 7, wherein the device is arranged to combine the series of exposures with a correction for sharpness enhancement.

10. A device according to claim 6, wherein the device is arranged to reset all pixels of the light sensitive sensor simultaneously.

11. A device according to claim 6, wherein the sensor is a digital CMOS image sensor, and the global shutter is a mechanical shutter.

* * * * *

UNITED STATES PATENT AND TRADEMARK OFFICE
CERTIFICATE OF CORRECTION

| | | |
|---|---|---|
| PATENT NO. | : 7,962,034 B2 | Page 1 of 1 |
| APPLICATION NO. | : 11/817824 | |
| DATED | : June 14, 2011 | |
| INVENTOR(S) | : Mats Wenersson | |

It is certified that error appears in the above-identified patent and that said Letters Patent is hereby corrected as shown below:

Front page, Section (60), Related U.S. Application Data should be added:
-- Related U.S. Application Data
(60) Provisional Application No. 60/689,228, filed on June 10, 2005. --

Specification, Column 1, line 3, CROSS REFERENCE TO RELATED APPLICATION should be added immediately after the title:
-- CROSS REFERENCE TO RELATED APPLICATION
This application is a §371 of International Application No. PCT/EP2006/050789 filed on February 9, 2006, which claims benefit to U.S. Provisional Application No. 60/689,228 filed on June 10, 2005, and also claims priority to European Application No. 05101794.5 filed on March 8, 2005 and European Application No. 05104695.1 filed on May 31, 2005. --

Signed and Sealed this
Eighth Day of November, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,962,034 B2 | Page 1 of 1 |
| APPLICATION NO. | : 11/817824 | |
| DATED | : June 14, 2011 | |
| INVENTOR(S) | : Mats Wernersson | |

It is certified that error appears in the above-identified patent and that said Letters Patent is hereby corrected as shown below:

In Column 6, line 22, "claim 7" should read --claim 6--; and
lines 29-30, ", and the global shutter is a mechanical shutter" is deleted.

Signed and Sealed this
Third Day of January, 2012

David J. Kappos
*Director of the United States Patent and Trademark Office*